United States Patent [19]
Letavic et al.

[11] Patent Number: 5,969,387
[45] Date of Patent: *Oct. 19, 1999

[54] LATERAL THIN-FILM SOI DEVICES WITH GRADED TOP OXIDE AND GRADED DRIFT REGION

[75] Inventors: Theodore Letavic, Putnam Valley; Mark Simpson, Ossining, both of N.Y.

[73] Assignee: Philips Electronics North America Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 09/100,832

[22] Filed: Jun. 19, 1998

[51] Int. Cl.$^6$ ...................................................... H01L 27/12
[52] U.S. Cl. .......................... 257/347; 257/335; 257/409; 257/647
[58] Field of Search ................................... 257/347, 367, 257/409, 647, 335

[56] References Cited

U.S. PATENT DOCUMENTS

| | | | |
|---|---|---|---|
| 4,247,860 | 1/1981 | Tihanyi | 257/404 |
| 5,246,870 | 9/1993 | Merchant | 437/21 |
| 5,362,979 | 11/1994 | Merchant | 257/340 |
| 5,378,912 | 1/1995 | Pein | 257/335 |
| 5,412,241 | 5/1995 | Merchant | 257/409 |
| 5,541,435 | 7/1996 | Beasom | 257/344 |
| 5,648,671 | 7/1997 | Merchant | 257/347 |
| 5,710,451 | 1/1998 | Merchant | 257/347 |
| 5,767,547 | 6/1998 | Merchant et al. | 257/347 |
| 5,780,900 | 7/1998 | Suzuki et al. | 257/347 |

FOREIGN PATENT DOCUMENTS

0786818A2  7/1997  European Pat. Off. .

*Primary Examiner*—David B. Hardy
*Attorney, Agent, or Firm*—Steven R. Biren

[57] ABSTRACT

A lateral thin-film Silicon-On-Insulator (SOI) device includes a lateral semiconductor device such as a diode or MOSFET provided in a thin semiconductor film on a thin buried oxide. The lateral semiconductor device structure includes at least two semiconductor regions separated by a lateral drift region. A top oxide insulating layer is provided over the thin semiconductor film and a conductive field plate is provided on the top oxide insulating layer. In order to provide enhanced device performance, a portion of the top oxide layer increases in thickness in a substantially continuous manner, while a portion of the lateral drift region beneath the top oxide layer decreases in thickness in a substantially continuous manner, both over a distance which is at least about a factor of five greater than the maximum thickness of the thin semiconductor film.

10 Claims, 1 Drawing Sheet

LATERAL THIN-FILM SOI DEVICES WITH GRADED TOP OXIDE AND GRADED DRIFT REGION

BACKGROUND OF THE INVENTION

The invention is in the field of Semiconductor-On-Insulator (SOI) devices, and relates more specifically to lateral thin-film SOI devices such as MOSFETS and diodes suitable for high-voltage and power applications.

In fabricating high-voltage power devices, tradeoffs and compromises must typically be made in areas such as breakdown voltage, size, conduction losses and manufacturing simplicity and reliability. Frequently, improving one parameter, such as breakdown voltage, will result in the degradation of another parameter, such as conduction losses. Ideally, such devices would feature superior characteristics in all areas, with a minimum of operational and fabrication drawbacks.

Improvements over the basic SOI structure, in which increased breakdown voltages are achieved by providing a linear doping profile in the drift region, are shown in related U.S. Pat. No. 5,246,870 and U.S. Pat. No. 5,412,241, both commonly assigned with the instant application and incorporated herein by reference. In these SOI devices, the drift region between the channel and drain in a lateral MOS structure is provided with various features, such as a thinned portion and a linear lateral doping density profile, which result in substantially increased breakdown voltage characteristics. Additionally, a top field plate is provided over a field oxide of essentially constant thickness to permit twice the conducting charge to be placed in the drift region, thereby reducing conduction losses without reducing breakdown voltage. However, to maintain high breakdown voltage, the total amount of conduction charge near the source side of the drift region must be kept very small, thereby leading to a bottleneck for current flow and preventing optimum reduction in conduction losses.

Another improvement over the basic SOI structure is shown in U.S. Pat. No. 5,648,671, also commonly assigned with the instant application and incorporated herein by reference. This patent shows a lateral thin-film SOI device with a linearly-graded field oxide region and a linear doping profile, features which serve to reduce conduction losses without reducing breakdown voltage. Yet another improved high-voltage thin-film device is disclosed in U.S. patent application Ser. No. 08/998,048, commonly assigned with the instant application, co-invented by the present inventor and incorporated herein by reference. This application discloses another technique for improving such devices, employing a step oxide region of intermediate thickness to increase current-carrying capability while maintaining a high breakdown voltage.

While all of the foregoing structures offer an improvement over standard SOI structures, they still suffer from the drawback that they cannot operate effectively and efficiently at high current levels in the source-follower mode, wherein a "source-high" bias condition may be encountered during operation and a high breakdown voltage must be maintained in a device which must also handle high current levels.

Accordingly, it would be desirable to have a lateral thin-film SOI device configuration of the type described above, but in which operation, and particularly operation of a MOSFET device in the source-follower mode, is enhanced by significantly increasing permissible saturated current flow and reducing the on resistance of the device structure while maintaining high breakdown voltage capability.

SUMMARY OF THE INVENTION

It is therefore an object of the invention to provide a lateral thin-film SOI device capable of improved performance, particularly of a MOSFET in the source-follower mode, by virtue of a design configuration which results in a significant increase in the saturated current flow and a reduction in the minimum attainable specific on resistance of the device structure without compromising the breakdown voltage capability of the device. In accordance with the invention, these objects are achieved in a lateral thin-film SOI device of the type having a semiconductor substrate, a thin buried oxide insulating layer on the substrate, and a lateral semiconductor device provided in a thin semiconductor film on the thin buried oxide. The thin semiconductor film includes a first region of a first conductivity type, a second region of a second conductivity type opposite to that of the first and spaced apart from the first region by a lateral drift region of the second conductivity type, a top oxide insulating layer over the thin semiconductor film, and a conductive field plate on the top oxide insulating layer. In accordance with the invention, the objects discussed above are achieved by providing the top oxide insulating layer with a layer portion adjacent the first region which increases in thickness in a substantially continuous manner in a direction from the first region toward the second region over a distance of at least about a factor of five greater than a maximum thickness of the top oxide insulating layer, and by providing the lateral drift region with a region portion adjacent the first region which decreases in thickness in the same substantially continuous manner in a direction from the first region toward the second region and over the same distance. Such a configuration provides a substantially thicker semiconductor film region adjacent the first region and also provides a substantially thinner top oxide insulating layer in this region. Additionally, such a device configuration avoids sharp edges and steep slopes in the oxide and semiconductor film layers in this region. These features, in combination, result in the performance advantages discussed above, which are of particular importance in source-follower mode operation of MOSFET devices.

In a preferred embodiment of the invention, the SOI device is a MOSFET device, while in a further preferred embodiment of the invention the device may be a diode, in which case the features of the invention will provide enhanced performance due to a reduced forward voltage drop at a given current (thus reducing conduction losses) and can also increase diode breakdown voltage.

In further preferred embodiments of the invention, the increases and decreases in thickness described above may occur in either a substantially linear manner, or in a non-linear manner such as in accordance with a square-root function.

Thus, SOI devices in accordance with the present invention offer a significant improvement in that high current and high voltage handling capability is substantially enhanced, and in particular in that source-follower operation of MOSFET devices is substantially enhanced.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

Figure 1:
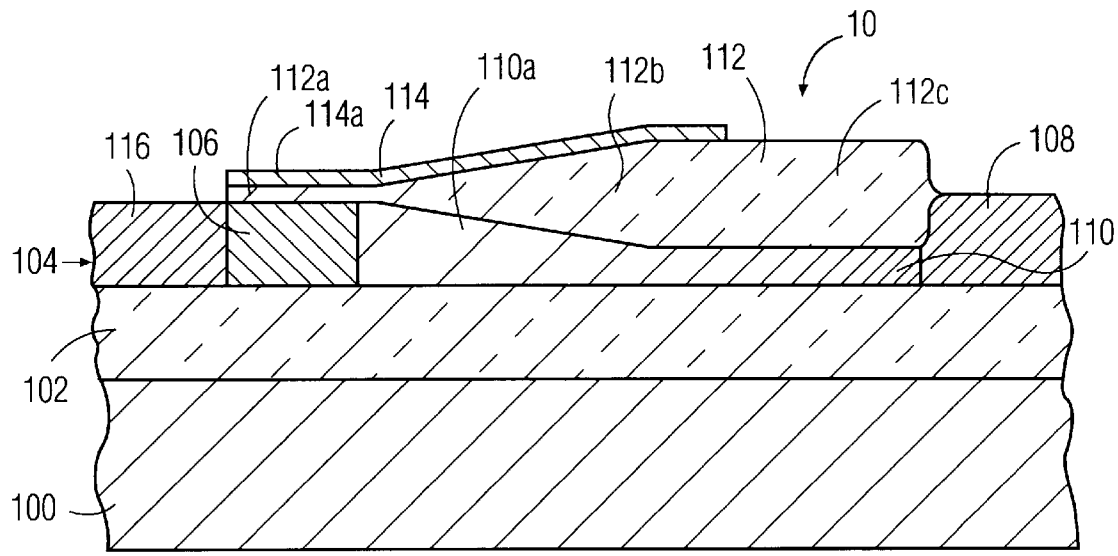
FIG. 1 shows a simplified cross-sectional view of a lateral SOI MOSFET device in accordance with a first embodiment of the invention.

In the drawing, semiconductor regions having the same conductivity type are generally shown hatched in the same direction, and it should be noted that the figures are not drawn to scale.

DESCRIPTION OF THE PREFERRED EMBODIMENTS

A lateral thin-film SOI MOSFET structure 10 in accordance with the invention is shown in simplified cross-section in FIG. 1. This structure includes a semiconductor substrate 100, typically of n-type silicon material having a doping concentration of $10^{18}$–$10^{20}$ at /cm$^3$, on which is provided a thin buried oxide insulating layer 102, typically a silicon oxide layer of between about 0.1 micron and 5.0 microns thickness. In the device shown, insulating layer 102 may advantageously have a thickness in the range of 2–3 microns.

A thin semiconductor film 104 is provided on insulating layer 102 and has a thickness in the range of about 0.1–2.0 micron, with a lateral semiconductor device, in this case a MOSFET provided in the thin semiconductor film 104. In the embodiment shown in FIG. 1, the thin semiconductor film 104 includes a first region 106, here of p-type conductivity and having a doping level of about $10^{17}$ at /cm$^3$, which serves as a channel region of the device. A drain of the device is formed by a second region 108, here of n-type conductivity and having a doping level of about $10^{18}$ at /cm$^3$. The second region 108 is spaced apart from the first region 106 by a semiconductor lateral drift region 110, here of n-type conductivity and in this example having a substantially linear lateral doping profile, with a charge concentration of about $1.0 \times 10^{12}$ at /cm$^2$ at its left (channel) side and a charge concentration of about $2.0 \times 10^{13}$ at /cm$^2$ at its right (drain) side.

In general, the doping level of the lateral drift region should increase linearly by a factor of at least about 40.

In the MOSFET embodiment of FIG. 1, thin semiconductor film 104 additionally includes a third region 116 of n-type conductivity located alongside the first region 106 at a side thereof remote from the lateral drift region 110. This third region, which forms the source region of MOSFET transistor 10, can have a doping level substantially equal to that of second region 108 (which forms the drain region of the MOSFET device), in this example about $10^{18}$ at cm$^3$. Additionally, a conductive field plate 114 over the top oxide insulating layer 112 extends over and parallel to channel region 106 to form a gate electrode of the MOSFET device. The portion of the conductive field plate 114 which extends over and parallel to the channel region 106 is designated by reference numeral 114a in FIG. 1, and is insulated from the thin semiconductor film 104 by a thin portion 112a of top oxide insulating layer 112, which forms a gate oxide and is of constant thickness, here about 0.1 micron or less.

The top oxide insulating layer 112 is provided over the thin semiconductor film 104 and has a substantially tapered portion 112b over a portion of lateral drift region 110 which increases in thickness from adjacent the first region 106 toward the second region 108. In the present example, the thickness of the top oxide insulating layer 112 varies from a minimum of about 0.05 micron at the area 112a adjacent the first region 106 to about 2 microns (depending upon the thickness of film 104) at the area 112c adjacent the second region 108.

Advantageously, the maximum thickness of the top oxide insulating layer 112, at the area 112c, can be made substantially equal to the thickness of thin buried oxide insulting layer 102.

In accordance with the invention (and directly contrary to the structure in U.S. Pat. No. 5,648,671), the portion of the top oxide insulating layer 112b adjacent the first region 106 increases in thickness in a substantially continuous manner in a direction from the first region toward the second region 108 by having both its upper and lower surfaces tapering outwardly, over a distance that may typically be at least about a factor of five greater than the maximum thickness of the top oxide insulating layer. Likewise, and as a direct result of the tapered lower surface of the top oxide insulating layer 112 in the region 112b, the lateral drift region 110 has a corresponding region portion 110a adjacent the first region 106 which has a corresponding decrease in thickness in a substantially continuous manner in the direction from the first region toward the second region. Typically, this tapering of both the top oxide insulating layer and the lateral drift region will occur over a distance which is at least about a factor of five greater than the maximum thickness of the thin semiconductor film 104. While it should be understood that a wide range of dimensional values are contemplated within the scope of the invention, the thin semiconductor film 104 may have a maximum thickness of about 1.5 micron, with the maximum thickness of the top oxide insulating layer portion 112c having a maximum thickness of about 2.0 microns, in which case the lateral drift region 110 will have a minimum thickness of about 0.45 micron at its right-hand side.

The conductive field plate 114 located on the top of the top oxide insulating layer 112 may be made of polysilicon, polysilicon and metal, or other suitable conductive materials.

Electrical connections to the conductive field plate 114, as well as the various semiconductor regions and the substrate 100 are made in a conventional manner well known to those of ordinary skill in this art and are accordingly not shown or described further here.

It is within the contemplated scope of the invention that the variation in thickness of the top oxide insulating layer 112 and the lateral drift region 110 may vary in different, but substantially continuous, manners. Thus, in the embodiment shown in FIG. 1, this variation in thickness takes the form of a substantially linear variation, while in the partial simplified cross-sectional view of FIG. 2, a device 12 is shown which is generally similar to the device shown in FIG. 1 except that the variation in thickness, at the portions designated 110a and 112b, is shown as a substantially nonlinear variation, such as a square-root function. The precise manner of the variation in thickness to be selected will be a function of the particular device parameters to be achieved, as will be apparent to those of ordinary skill in the art.

Figure 3:
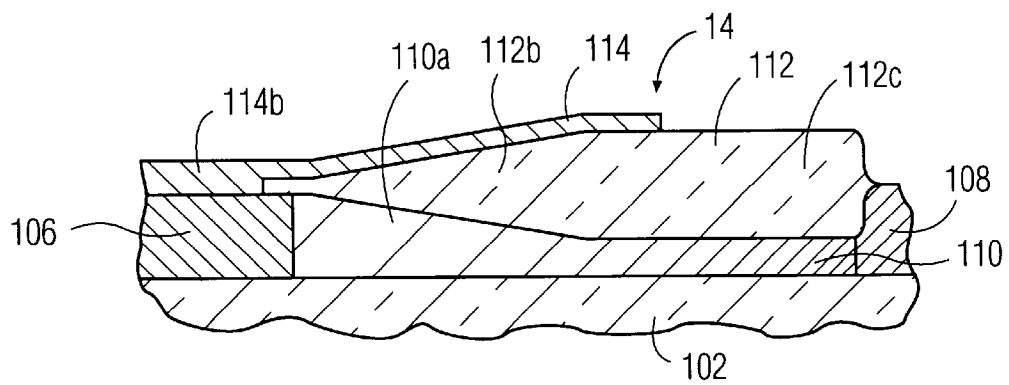
FIG. 3 shows a simplified cross-sectional view of a lateral SOI diode device in accordance with a third embodiment of the invention.

Yet another embodiment of the invention, in the form of a lateral thin-film SOI diode structure 14, is shown in simplified partial cross-section in FIG. 3. This diode structure is similar to the structures previously described, and in particular FIG. 1, except that the source region 116 has been eliminated, and the conductive field plate 114 has a portion 114b which contacts first region 106, which in this embodiment serves as an anode of the diode device. The cathode of the device is formed by second region 108, and in other respects the device is similar to that shown in FIG. 1 and accordingly will not be described in further detail. As in the MOSFET embodiments previously described, the variations in thickness of the top oxide insulating layer and the lateral drift region may be either linear (as shown) or nonlinear variations.

Figure 2:
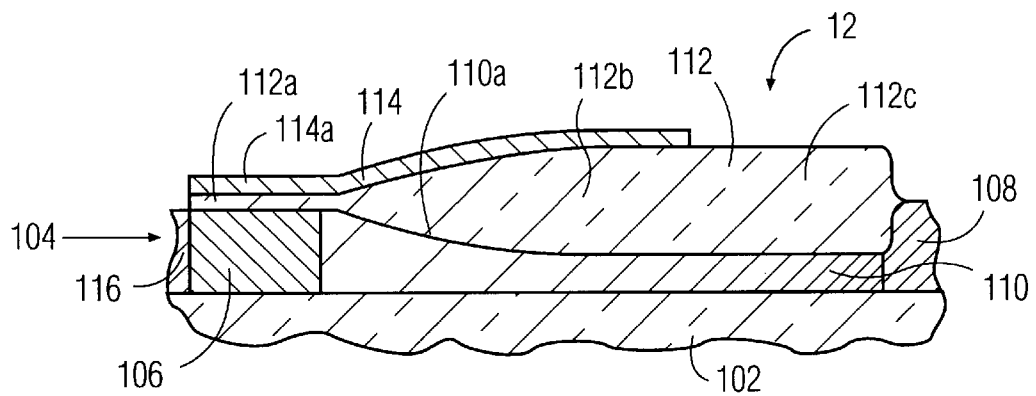
FIG. 2 shows a simplified cross-sectional view of a portion of a lateral SOI MOSFET device in accordance with a second embodiment of the invention.

Devices in accordance with the present invention, such as those shown in FIGS. 1–3, can be made using conventional processing techniques well known to those of ordinary skill in this art. Thus, for example, the linear doping profile in region 110 can be achieved using a method such as that disclosed in U.S. Pat. No. 5,30,488, incorporated herein by reference, while the tapered top oxide insulating layer 112 and drift region 110 can be formed using LOCOS techniques, such as those described in U.S. patent application Ser. No. 08/998,048.

Devices in accordance with the present invention achieve the advantages of significantly increasing permissible saturated current flow and reducing the on resistance of the device structure while improving high breakdown voltage capability. This is accomplished by providing a substantially thicker semiconductor film region adjacent the first region and also providing a substantially thinner top oxide insulating layer in this region. Additionally, by tapering the semiconductor film and top oxide insulating layer over a substantially greater lateral distance than in the prior art, and in a substantially continuous manner, sharp edges and steep slopes in the oxide and semiconductor film layers are avoided in this region, thus increasing breakdown voltage. These features, in combination, result in a substantially improved device structure, featuring the performance advantages discussed above.

While the invention has been particularly shown and described with reference to several preferred embodiments thereof, it will be understood by those skilled in the art that various changes in form and detail may be made without departing from the spirit or scope of the invention.

What is claimed is:

1. A lateral thin-film Silicon-On-Insulator (SOI) device comprising a semiconductor substrate, a thin buried oxide insulating layer on said substrate, and a lateral semiconductor device provided in a thin semiconductor film on said thin buried oxide, said thin semiconductor film comprising a first region of a first conductivity type, a second region of a second conductivity type opposite to that of the first and spaced apart from said first region by a lateral drift region of said second conductivity type, a top oxide insulating layer over said thin semiconductor film, and a conductive field plate on said top oxide insulating layer, characterized in that said top oxide insulating layer comprises a layer portion adjacent said first region which increases in thickness in a substantially continuous manner in a direction from said first region toward said second region over a distance of at least about a factor of five times greater than a maximum thickness of said thin semiconductor film, and said lateral drift region comprises a region portion adjacent said first region which decreases in thickness in said substantially continuous manner in a direction from said first region toward said second region over a like distance of at least about a factor of five times greater than a maximum thickness of said thin semiconductor film.

2. A lateral thin-film Silicon-On-Insulator (SOI) device as claimed in claim 1, wherein said device comprises a diode, said field plate is connected to said first region, which forms a first electrode of said diode, and said second region forms a second electrode of said diode.

3. A lateral thin-film Silicon-On-Insulator (SOI) device as in claim 2, wherein a maximum thickness of said top oxide insulating layer is substantially equal to a thickness of said thin buried oxide insulating layer.

4. A lateral thin-film Silicon-On-Insulator (SOI) device as claimed in claim 1, wherein said device comprises a MOSFET, said thin semiconductor film further comprises a third region of said second conductivity type alongside said first region at a side thereof remote from said lateral drift region, said conductive field plate extends over and is insulated from said first region to form a gate electrode of said MOSFET, and said third and second regions form a source and a drain region of said MOSFET.

5. A lateral thin-film Silicon-On-Insulator (SOI) device as in claim 4, wherein a maximum thickness of said top oxide insulating layer is substantially equal to a thickness of said thin buried oxide insulating layer.

6. A lateral thin-film Silicon-On-Insulator (SOI) device as claimed in claim 1, wherein a doping level of said lateral drift region increases linearly in a direction from said first region to said second region.

7. A lateral thin-film Silicon-On-Insulator (SOI) device as in claim 6, wherein said doping level increases linearly by a factor of at least about 40.

8. A lateral thin-film Silicon-On-Insulator (SOI) device as in claim 1, wherein said layer portion of the top oxide insulating layer increases in thickness in a substantially linear manner, and said region portion of the lateral drift region decreases in thickness in said substantially linear manner.

9. A lateral thin-film Silicon-On-Insulator (SOI) device as in claim 1, wherein said layer portion of the top oxide insulating layer increases in thickness in a substantially nonlinear manner, and said region portion of the lateral drift region decreases in thickness in said substantially nonlinear manner.

10. A lateral thin-film Silicon-On-Insulator (SOI) device as in claim 9, wherein said nonlinear manner comprises a square-root function.

* * * * *